(12) United States Patent
Takada et al.

(10) Patent No.: US 9,030,249 B2
(45) Date of Patent: May 12, 2015

(54) LEVEL SHIFT CIRCUIT

(71) Applicant: Seiko Instruments Inc., Chiba-shi, Chiba (JP)

(72) Inventors: Kosuke Takada, Chiba (JP); Atsushi Igarashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 14/182,950

(22) Filed: Feb. 18, 2014

(65) Prior Publication Data

US 2014/0232447 A1    Aug. 21, 2014

(30) Foreign Application Priority Data

Feb. 20, 2013   (JP) .................................. 2013-031367

(51) Int. Cl.
*H03L 5/00*      (2006.01)
*H03L 5/02*      (2006.01)
*H03K 3/356*     (2006.01)
*H03K 19/0185*   (2006.01)

(52) U.S. Cl.
CPC .......... *H03L 5/02* (2013.01); *H03K 19/018507* (2013.01); *H03K 3/356086* (2013.01)

(58) Field of Classification Search
CPC .............. H03K 19/018507; H03K 19/018514; H03K 19/018521
USPC ....................................... 327/333; 326/80–81
See application file for complete search history.

(56) References Cited

U.S. PATENT DOCUMENTS

| | | | | |
|---|---|---|---|---|
| 6,445,210 | B2* | 9/2002 | Nojiri ............................. | 326/68 |
| 7,112,996 | B2* | 9/2006 | Lee ................................. | 326/68 |
| 7,501,876 | B2* | 3/2009 | Kimura ......................... | 327/333 |
| 7,675,345 | B2* | 3/2010 | Fayed ........................... | 327/333 |
| 8,643,425 | B2* | 2/2014 | Chaudhry et al. ............ | 327/333 |

* cited by examiner

*Primary Examiner* — Kenneth Wells
(74) *Attorney, Agent, or Firm* — Brinks Gilson & Lione

(57) ABSTRACT

There is provided a level shift circuit free from malfunction. The level shift circuit converts a signal of a first power supply voltage of a first supply terminal, which is supplied to an input terminal, into a signal of a second power supply voltage of a second supply terminal and outputs the converted signal to an output terminal. The level shift circuit has a control circuit that detects when the first power supply voltage reduces below a predetermined voltage. The voltage of the output terminal of the level shift circuit is fixed to the second power supply voltage or a ground voltage according to a detection signal of the control circuit.

6 Claims, 2 Drawing Sheets

LEVEL SHIFT CIRCUIT

RELATED APPLICATIONS

This application claims priority under 35 U.S.C. §119 to Japanese Patent Application No. 2013-031367 filed on Feb. 20, 2013, the entire content of which is hereby incorporated by reference.

BACKGROUND OF THE INVENTION

1. Field of the Invention

The present invention relates to a level shift circuit mounted on a semiconductor device.

2. Background Art

A conventional level shift circuit will be described. FIG. 2 is a circuit diagram illustrating a conventional level shift circuit.

When an input voltage VIN goes to a high level, namely, a first power supply voltage VDD1, then an inverter 51 causes the gate voltage of an NMOS transistor 52 to become a ground voltage VSS. This causes the NMOS transistor 52 to turn off. Meanwhile, an NMOS transistor 53 turns on and an output voltage VOUT goes to a low level, namely, the ground voltage VSS. At this time, a PMOS transistor 54 is on, the voltage of an internal node N1 is a second power supply voltage VDD2, and a PMOS transistor 55 is off Further, when the input voltage VIN goes to the low level, namely, the ground voltage VSS, the inverter 51 causes the gate voltage of the NMOS transistor 52 to become the first power supply voltage VDD1. Then, the NMOS transistor 52 turns on, the voltage of the internal node N1 becomes the ground voltage VSS, the PMOS transistor 55 turns on, and the output voltage VOUT goes to the high level, namely, the second power supply voltage VDD2. At this time, the NMOS transistor 53 is off (refer to, for example, Patent Document 1).

[Patent Document 1] Japanese Patent Application Laid-Open No. 2012-134690

However, according to the art disclosed in Patent Document 1, if the first power supply voltage VDD1 becomes lower than a minimum operating power supply voltage of the level shift circuit, then the circuit malfunctions, inconveniently making the output voltage VOUT unstable.

SUMMARY OF THE INVENTION

The present invention has been made with a view toward solving the problem described above and an object of the invention is to provide a level shift circuit free from malfunction.

To solve the problem described above, a level shift circuit according to the present invention is adapted to convert a signal of a first power supply voltage of a first supply terminal, which is supplied to an input terminal, into a signal of a second power supply voltage of a second supply terminal and outputs the converted signal to an output terminal. The level shift circuit includes a control circuit which detects when the first power supply voltage reduces below a predetermined voltage. The voltage of the output terminal of the level shift circuit is fixed to the second power supply voltage or a ground voltage by a detection signal of the control circuit.

According to the present invention, if the first power supply voltage is lower than the minimum operating power supply voltage, an output voltage of the level shift circuit is forcibly fixed to the second power supply voltage or the ground voltage, thus preventing the level shift circuit from malfunctioning.

DETAILED DESCRIPTION OF THE PREFERRED EMBODIMENTS

The following will describe an embodiment of the present invention with reference to the accompanying drawings.

Figure 1:
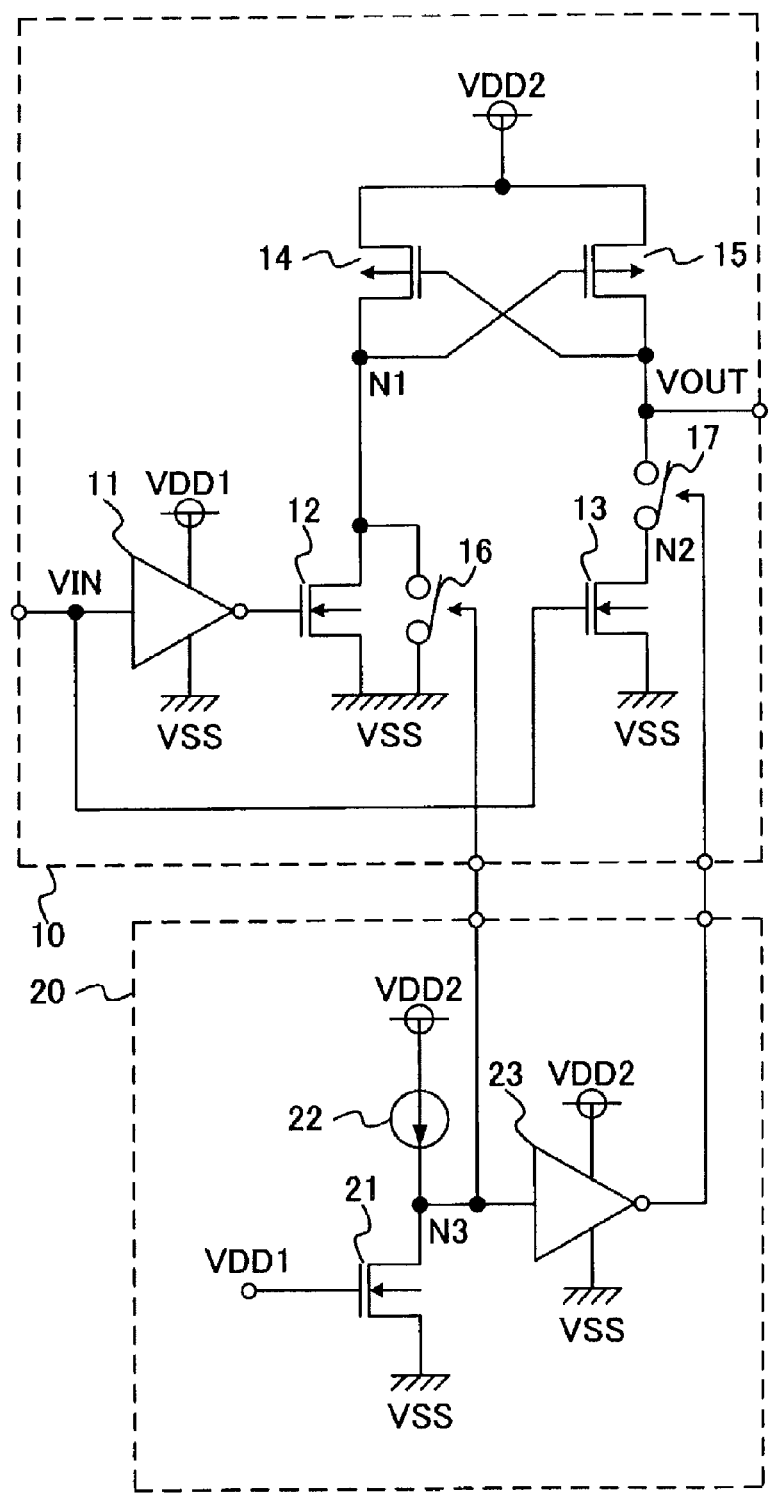
FIG. 1 is a circuit diagram illustrating a level shift circuit according to an embodiment of the present invention.
Figure 2:
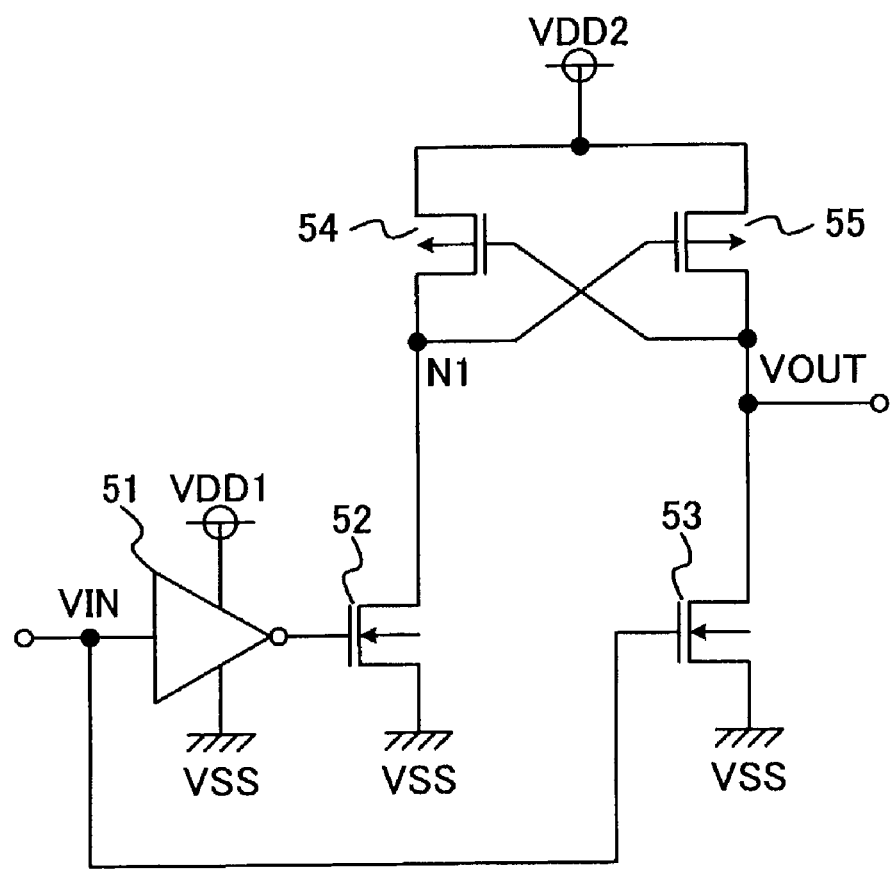
FIG. 2 is a circuit diagram illustrating a conventional level shift circuit.

First, the configuration of a level shift circuit will be described. FIG. 1 is a circuit diagram of the level shift circuit. In the figure, the voltage of a first supply terminal is a first power supply voltage VDD1, the voltage of a second supply terminal is a second power supply voltage VDD2, and the voltage of a ground terminal is a ground voltage VSS. The level shift circuit converts a received signal of the first power supply voltage VDD1 into a signal of the second power supply voltage VDD2 and outputs the converted signal.

The level shift circuit includes a signal processing circuit 10 and a control circuit 20. The signal processing circuit 10 has an inverter 11, NMOS transistors 12 and 13, PMOS transistors 14 and 15, and switches 16 and 17. The control circuit 20 has an NMOS transistor 21, a current source 22, and an inverter 23.

In the level shift circuit, the input terminal of the signal processing circuit 10 is the input terminal of the level shift circuit. The output terminal of the signal processing circuit 10 serves as the output terminal of the level shift circuit. A first control signal terminal of the signal processing circuit 10 and a first control signal terminal of the control circuit 20 are interconnected. A second control signal terminal of the signal processing circuit 10 and a second control signal terminal of the control circuit 20 are interconnected.

In the signal processing circuit 10, the input terminal of the inverter 11 is connected to the input terminal of the signal processing circuit 10 and the gate of the NMOS transistor 13, the output terminal thereof is connected the gate of the NMOS transistor 12, the supply terminal thereof is connected to the first supply terminal, the ground terminal thereof is connected to a ground terminal. The source of the NMOS transistor 12 is connected to a ground terminal, while the drain thereof is connected to an internal node N1. The source of the NMOS transistor 13 is connected to a ground terminal, while the drain thereof is connected to an internal node N2. The switch 16 is provided between the internal node N1 and the ground terminal. The switch 17 is provided between the output terminal of the signal processing circuit 10 and the internal node N2. The gate of the PMOS transistor 14 is connected to the output terminal of the signal processing circuit 10, the source thereof is connected to a second supply terminal, and the drain thereof is connected to the internal node N1. The gate of the PMOS transistor 15 is connected to the internal node N1, the source thereof is connected to the second supply terminal, and the drain thereof is connected to the output terminal of the signal processing circuit 10. The switch 16 is controlled by a signal of the first control signal terminal of the signal processing circuit 10. The switch 17 is controlled by a signal of the second control signal terminal of the signal processing circuit 10.

In the control circuit 20, the gate of the NMOS transistor 21 is connected to a first supply terminal, the source thereof is connected to a ground terminal, and the drain thereof is connected to an internal node N3. The current source 22 is provided between the second supply terminal and the internal node N3. The input terminal of the inverter 23 is connected to the internal node N3 and a first control signal terminal of the control circuit 20, the output terminal thereof is connected to a second control signal terminal of the control circuit 20, the supply terminal thereof is connected to a second supply terminal, and the ground terminal thereof is connected to a ground terminal.

The NMOS transistor 21 and the current source 22 constitute a voltage detector circuit. The input terminal of the voltage detector circuit is the gate of the NMOS transistor 21, while the output terminal thereof is the internal node N3. The voltage detector circuit detects when the first power supply voltage VDD1 becomes a voltage of the total of a minimum operating power supply voltage and a predetermined voltage. The voltage is a threshold voltage of the voltage detector circuit, which is higher by a predetermined voltage than a power supply voltage at which the level shift circuit cannot actually operate, namely, the minimum operating power supply voltage. The predetermined voltage is adjusted, as necessary, according to the specifications of a semiconductor device. More specifically, the threshold voltage of the voltage detector circuit is adjusted by adjusting, as necessary, the threshold voltage and the size of the NMOS transistor 21 and the current amount of the current source 22.

A description will now be given of the operation of the level shift circuit in the case where the first power supply voltage VDD1 is lower than the minimum operating power supply voltage.

At this time, the first power supply voltage VDD1 is lower than the threshold voltage of the voltage detector circuit. This causes the NMOS transistor 21 to turn off. The voltage of the internal node N3 is pulled up by the current source 22 to the second power supply voltage VDD2. In other words, the first control signal becomes the second power supply voltage VDD2. The switch 16 is composed of, for example, an NMOS transistor, and when the gate voltage reaches the second power supply voltage VDD2, the switch 16 turns on, causing the voltage of the internal node N1 to become the ground voltage VSS. Hence, the PMOS transistor 15 turns on, and the output voltage VOUT is forcibly fixed to the second power supply voltage VDD2. Thus, in the case where the first power supply voltage VDD1 is lower than the minimum operating power supply voltage, the output voltage VOUT of the level shift circuit is forcibly fixed to the second power supply voltage VDD2, thus preventing the level shift circuit from malfunctioning.

The voltage of the internal node N3 is the second power supply voltage VDD2, so that the second control signal is set to the ground voltage VSS by the inverter 23. The switch 17 is, for example, an NMOS transistor, and the gate voltage is the ground voltage VSS, so that the switch 17 is off.

Thus, if the first power supply voltage VDD1 is lower than the threshold voltage of the voltage detector circuit, then the output voltage VOUT of the level shift circuit is forcibly fixed to the second power supply voltage VDD2.

A description will now be given of the operation of the level shift circuit in the case where the first power supply voltage VDD1 is higher than a voltage of the total of the minimum operating power supply voltage and the predetermined voltage.

At this time, the first power supply voltage VDD1 is higher than the threshold voltage of the voltage detector circuit. This causes the NMOS transistor 21 to turn on. The voltage of the internal node N3 becomes the ground voltage VSS. In other words, the first control signal becomes the ground voltage VSS, so that the switch 16 turns off. Further, the inverter 23 causes the second control signal to be the second power supply voltage VDD2, so that the switch 17 turns on.

Then, when the input voltage VIN goes to the high level, namely, the first power supply voltage VDD1, the inverter 11 causes the gate voltage of the NMOS transistor 12 to become the ground voltage VSS. This turns the NMOS transistor 12 off. Meanwhile, the NMOS transistor 13 turns on and the output voltage VOUT goes to the low level, namely, the ground voltage VSS. At this time, the PMOS transistor 14 is on, the voltage of the internal node N1 is the second power supply voltage VDD2, and the PMOS transistor 15 is off.

Further, when the input voltage VIN goes to the low level, namely, the ground voltage VSS, the inverter 11 causes the gate voltage of the NMOS transistor 12 to become the first power supply voltage VDD1. Then, the NMOS transistor 12 turns on, the voltage of the internal node N1 becomes the ground voltage VSS, the PMOS transistor 15 turns on, and the output voltage VOUT goes to the high level, namely, the second power supply voltage VDD2. At this time, the NMOS transistor 13 is off.

If the first power supply voltage VDD1 is higher than the threshold voltage of the voltage detector circuit as described above, then the output voltage VOUT of the level shift circuit depends on the input voltage VIN.

The current source 22 may use, for example, a resistive element, as long as the pull-up function is implemented.

Further, the control signal supplied to the switch 16 and the control signal supplied to the switch 17 may be interchanged, and the output terminal and the internal node N1 of the level shift circuit may be interchanged.

The gate of the NMOS transistor 21 is directly connected to the first supply terminal. Alternatively, however, the gate of the NMOS transistor 21 may be connected to the first supply terminal through a resistance voltage divider circuit.

What is claimed is:

1. A level shift circuit adapted to convert a signal of a first power supply voltage of a first supply terminal, which is supplied to an input terminal, into a signal of a second power supply voltage of a second supply terminal and outputs the converted signal to an output terminal, the level shift circuit comprising:
    a control circuit configured to detect whether the first power supply voltage is above a predetermined voltage,
    a first transistor configured to set a voltage of the output terminal to the second power supply voltage when the signal supplied to the input terminal is below a threshold;
    a first switch connected in parallel to the first transistor;
    a second transistor configured to set the voltage of the output terminal to the ground voltage when the signal supplied to the input terminal is above the threshold; and
    a second switch connected between the second transistor and the output terminal,
    wherein the first switch and the second switch are controlled by a detection signal of the control circuit, and
    wherein a voltage of the output terminal of the level shift circuit is fixed to one of the second power supply voltage or a ground voltage according to the detection signal of the control circuit.

2. The level shift circuit according to claim 1, wherein the first transistor and the second transistor correspond to NMOS transistors.

3. The level shift circuit according to claim 2, wherein the control circuit comprises:
    an third NMOS transistor having a gate thereof connected to the first supply terminal, a source thereof connected to a ground terminal, and a drain thereof connected to a first output terminal of the control circuit;

a resistive element provided between the second supply terminal and the first output terminal of the control circuit; and an inverter provided between the drain of the third NMOS transistor and a second output terminal of the control circuit, wherein the first switch is controlled by a signal of the first output terminal, and the second switch is controlled by a signal of the second output terminal.

4. A level shift circuit mounted on a semiconductor device, comprising:

a signal processing circuit and a control circuit, wherein the signal processing circuit comprises:

a first NMOS transistor having a source thereof connected to a ground terminal and a drain thereof connected to a first internal node;

a second NMOS transistor having a source thereof connected to a ground terminal and a drain thereof connected to a second internal node;

a first inverter having an input terminal thereof connected to an input terminal of the signal processing circuit and a gate of the second NMOS transistor, an output terminal thereof connected to a gate of the first NMOS transistor, and a supply terminal thereof connected to a first supply terminal;

a first switch which is controlled by a signal of a first control signal terminal of the signal processing circuit and which is provided between the first internal node and a ground terminal;

a second switch which is controlled by a signal of a second control signal terminal of the signal processing circuit and which is provided between an output terminal of the signal processing circuit and the second internal node;

a first PMOS transistor having a gate thereof connected to the output terminal of the signal processing circuit, a source thereof connected to a second supply terminal, and a drain thereof connected to the first internal node; and a second PMOS transistor having a gate thereof connected to the first internal node, a source thereof connected to the second supply terminal, and a drain thereof connected to the output terminal of the signal processing circuit; and the control circuit comprises:

a voltage detector circuit which has an input terminal thereof connected to the first supply terminal and which detects when a first power supply voltage becomes a voltage of the total of a minimum operating power supply voltage and a predetermined voltage; and a second inverter having an input terminal thereof connected to an output terminal of the voltage detector circuit and the first control signal terminal, an output terminal thereof connected to the second control signal terminal, and a supply terminal thereof connected to the second supply terminal.

5. The level shift circuit according to claim 4, wherein the voltage detector circuit comprises:

a third NMOS transistor having a gate thereof connected to the first supply terminal, a source thereof connected to a ground terminal, and a drain thereof connected to the output terminal of the voltage detector circuit; and a resistive element provided between the second supply terminal and the output terminal of the voltage detector circuit.

6. The level shift circuit according to claim 5, wherein a threshold voltage of the voltage detector circuit is adjusted to be the total voltage.

* * * * *